(12) United States Patent
Inoue et al.

(10) Patent No.: US 11,800,802 B2
(45) Date of Patent: Oct. 24, 2023

(54) RADIATION DEVICE AND EMISSION COOLING DEVICE

(71) Applicants: SUMITOMO ELECTRIC INDUSTRIES, LTD., Osaka (JP); OSAKA UNIVERSITY, Suita (JP)

(72) Inventors: Takeshi Inoue, Osaka (JP); Hiroo Kanamori, Osaka (JP); Takafumi Ohtsuka, Osaka (JP); Junichi Takahara, Suita (JP); Kazunari Kimino, Suita (JP)

(73) Assignees: SUMITOMO ELECTRIC INDUSTRIES, LTD., Osaka (JP); OSAKA UNIVERSITY, Osaka (JP)

(*) Notice: Subject to any disclaimer, the term of this patent is extended or adjusted under 35 U.S.C. 154(b) by 320 days.

(21) Appl. No.: 17/261,287

(22) PCT Filed: Jul. 31, 2018

(86) PCT No.: PCT/JP2018/028674
§ 371 (c)(1),
(2) Date: Jan. 19, 2021

(87) PCT Pub. No.: WO2020/026345
PCT Pub. Date: Feb. 6, 2020

(65) Prior Publication Data
US 2021/0151654 A1 May 20, 2021

(51) Int. Cl.
*H10N 10/13* (2023.01)
(52) U.S. Cl.
CPC .......... *H10N 10/13* (2023.02); *F28F 2245/06* (2013.01)
(58) Field of Classification Search
CPC .............................. F28F 2245/06; H10N 10/13
See application file for complete search history.

(56) References Cited

U.S. PATENT DOCUMENTS

| 2015/0338175 A1 | 11/2015 | Raman et al. |
| 2016/0209680 A1* | 7/2016 | Chen ....................... G02F 1/015 |
| 2017/0219746 A1 | 8/2017 | Nagao et al. |

FOREIGN PATENT DOCUMENTS

| CN | 106772706 A | 5/2017 |
| JP | 2017-096516 A | 6/2017 |
| WO | 2016/031547 A1 | 3/2016 |

OTHER PUBLICATIONS

Dayal, Govind and Ramakrishna, S. Anantha, "Broadband infrared metamaterial absorber with visible transparency using ITO as ground plane", Optics Express, vol. 22, No. 12, pp. 15104-15110. (Year: 2014).*

(Continued)

*Primary Examiner* — Tamir Ayad
(74) *Attorney, Agent, or Firm* — Oliff PLC (57) ABSTRACT

A radiation device or the like has a structure for selectively converting thermal energy into an electromagnetic wave. The radiation device has a conductor layer, a semiconductor layer, and a plurality of conductor disks. The plurality of conductor disks are arranged on the semiconductor layer so that the same arrangement pattern is constituted in each of a plurality of unit constituent regions each having a rectangular shape with a side of 4.5 to 5.5 μm. The arrangement pattern of individual unit components includes nine conductor disks so as to correspond to a 3×3 matrix, and the nine conductor disks include four or more kinds of conductor disks having diameters different from each other. As a result, a two-dimensional periodic structure of the arrangement pattern is formed on the semiconductor layer.

7 Claims, 8 Drawing Sheets

(56) References Cited

OTHER PUBLICATIONS

Guddala, Sriram et al., "Thermally induced nonlinear optical absorption in metamaterial perfect absorbers", Applied Physics Letters 106, 111901, pp. 1-5. (Year: 2015).*

Liu et al., "Metasurface-based three dimensional sky radiator and auxiliary heat mirror", Proceedings of the 77th JSAP Autumn Meeting, Sep. 1, 2016, p. 03-375.

Oct. 30, 2018 International Search Report issued in International Patent Application No. PCT/JP2018/028674.

* cited by examiner

| TYPE | UNIT CONSTITUENT REGION R |
|---|---|
| A | 0.9　1.1　0.9<br>1.4　1.5　1.2<br>0.9　1.3　1.0<br>P=4.5μm |
| B | 0.9　1.1　0.9<br>1.4　1.5　1.2<br>0.9　1.3　1.0<br>P=5.1μm |
| C | 0.9　1.1　0.9<br>1.4　1.5　1.2<br>0.9　1.3　1.0<br>P=5.5μm |

Fig.8

RADIATION DEVICE AND EMISSION COOLING DEVICE

TECHNICAL FIELD

The present disclosure relates to a radiation device and an emission cooling device including the radiation device.

BACKGROUND ART

The transport of thermal energy by an electromagnetic wave is called "heat radiation" or simply "radiation," and a substance with stored thermal energy emits an electromagnetic wave with a wavelength determined by Planck's law due to radiation. Moreover, plasmons that are collective oscillations of electrons are generated at a metal and a dielectric interface. Note that a device having an artificial nano/micro-order fine structure that behaves in response to an electromagnetic wave including light, which is not found in an original substance, is called a metamaterial. In particular, among metamaterials, devices in which plasmons intervene are called plasmonic metamaterials.

It is known that a radiation device that controls a radiation spectrum by the above-described plasmonic metamaterial and radiates a selected wavelength can be configured. As a typical structure of such a radiation device using plasmons, there is known a stacked structure including a metal layer, a dielectric layer formed on the metal layer, and a metal layer including a metal pattern arranged on the dielectric layer and having a predetermined shape.

As an example of the radiation device, for example, as disclosed in Patent Document 1, a material that highly efficiently absorbs light and electromagnetic waves near a specific wavelength can be manufactured using, as a base, a stacked metamaterial of precious metal-dielectric-precious metal. Moreover, Patent Document 1 discloses a structure of an electromagnetic absorption and radiation device in which a metal layer 12, a conductor layer 14 formed on the metal layer 12 and a metal disk layer 16 formed on the conductor layer are included and the metal disk layer 16 includes a plurality of circular conductor disks 16a. Note that Patent Document 1 describes that an absorption wavelength changes depending on the diameters of the plurality of circular conductor disks 16a and discloses a narrow-band electromagnetic absorption and radiation device having radiation and absorption peaks at a single wavelength achieved by making the diameters of the plurality of conductor disks 16a included in the metal disk layer 16 equal.

Moreover, Patent Document 2 discloses an emission cooling device as an application example of the radiation device, though the emission cooling device is not a plasmonic metamaterial. This emission cooling device radiates heat converted into an electromagnetic wave having a wavelength of 8 to 13 μm to the outside of the atmosphere with use of a radiation device having high absorption and radiation characteristics in a wavelength region of 8 to 13 μm among so-called "atmospheric windows" that are wavelength regions where the influence of the atmosphere is small and an electromagnetic wave transmittance is high. Note that the "atmospheric windows" mean wavelength regions where the influence of the atmosphere is small and a light transmittance is high, and wavelength regions of 0.2 to 1.2 μm, 1.6 to 1.8 μm, 2 to 2.5 μm, 3.4 to 4.2 μm, 4.4 to 5.5 μm (4.5 to 5.5 μm), and 8 to 14 μm (8 to 13 μm) are known.

Furthermore, Non-Patent Document 1 discloses a radiation device equipped with a copper layer, an amorphous silicon layer formed on the copper layer, and a copper layer including a disk-shaped pattern formed on the amorphous silicon layer for the purpose of radiative cooling. Eight kinds of disks with different diameters (diameters of 800 to 1360 nm) are used for the disk-shaped copper layer to widen a radiation band, and a total of 25 disks that is five disks×five disks is arranged in a unit region with a period of 8 μm. Analysis results describe that high radiation characteristics can be obtained in the wavelength region of 8 to 13 μm.

CITATION LIST

Patent Literature

Patent Document 1: WO/2016/031547
Patent Document 2: US 2015/0,338,175 A1

Non-Patent Literature

Non-Patent Document 1: T. Liu et al., "Metasurface-based three dimensional sky radiator and auxiliary heat mirror" The 77th Autumn Meeting of the Japan Society of Applied Physics, Lecture No. 15p-B4-13 (2016)

SUMMARY OF INVENTION

A radiation device of the present disclosure comprises, at least, a conductor layer, a semiconductor layer, and a plurality of conductor disks. The conductor layer has a first lower surface and a first upper surface that are arranged so as to oppose each other along a first direction. The semiconductor layer is provided on the first upper surface of the conductor layer and has a second lower surface facing the first upper surface and a second upper surface opposing the second lower surface. The conductor disks are provided on the second upper surface of the semiconductor layer in a state in which the conductor disks are separated from each other. Moreover, the plurality of conductor disks are arranged so that the same arrangement pattern is constituted in each of a plurality of unit constituent regions having the same area and the same shape set on the second upper surface. Note that each of the plurality of unit constituent regions has a rectangular shape having a side with a length of 4.5 μm or more and 5.5 μm or less. The plurality of unit constituent regions having such a structure are arranged so that adjacent unit constituent regions have a common side along each of second and third directions that are defined on the second upper surface and orthogonal to each other. As a result, a two-dimensional periodic structure (plasmon periodic structure) of the arrangement pattern having periodicity along each of the second and third directions is constituted on the second upper surface. The arrangement pattern includes nine conductor disks arranged so as to correspond to a 3×3 matrix in which three elements are arranged along a first side of the rectangular shape and three elements are arranged along a second side orthogonal to the first side. Furthermore, the nine conductor disks include four or more kinds of conductor disks that have diameters that are defined on the second upper surface and different from each other.

Moreover, an emission cooling device of the present disclosure includes a radiation device having the above-described structure and as an example, is equipped with a radiation device according to the present embodiment mounted on a substrate layer including a material having relatively high heat conduction efficiency and capable of forming a smooth surface.

DESCRIPTION OF EMBODIMENTS

Problem to be Solved by Present Disclosure

As a result of examining conventional radiation devices and emission cooling devices, the present inventors have discovered the following problems. That is, in the above Non-Patent Document 1, an aim is to achieve an emission cooling device that radiates heat to the outside of the atmosphere by using the effect of plasmons, but only the wavelength region having a wavelength of 8 to 13 µm among the "atmospheric windows" is positively used. Therefore, energy corresponding to other wavelength regions stays in the radiation device. Moreover, radiation in wavelength bands other than the "atmospheric windows" is absorbed by the atmosphere. In this case, the re-radiation of the atmosphere is absorbed, which causes cooling efficiency to deteriorate.

Moreover, it is known that in the case of a metamaterial using a metal disk layer, an absorption wavelength depends on the diameter of a conductor disk. However, it is difficult to calculate backward an optimum diameter and arrangement of a plurality of conductor disks from desired absorption wavelength characteristics, and electromagnetic field analysis represented by a finite-difference time-domain method (FDTD method) method or the like is usually repeated, and a better design value is obtained by trial and error. Therefore, it has been difficult to determine a diameter and arrangement of a plurality of conductor disks having absorption characteristics in both the wavelength region of 8 to 13 µm and wavelength regions of the other "atmospheric windows."

The present disclosure has been made to solve the above-described problems, and it is an object of the present invention to provide a radiation device and an emission cooling device capable of selectively converting thermal energy into an electromagnetic wave in a wavelength region corresponding to another "atmospheric window" as well as a wavelength region corresponding to the conventionally used "atmospheric window."

Advantageous Effects of Present Disclosure

According to the present disclosure, it is possible to highly accurately use both a wavelength region of 8 to 13 µm corresponding to the "atmospheric window" and a wavelength region of 4.5 to 5.5 µm, and thermal energy radiation efficiency can be improved. That is, a resonance mode due to the effect of plasmons confined in a stacked structure of the radiation device is selectively emitted by the plasmon periodic structure as an electromagnetic wave of the "atmospheric window" corresponding to the wavelength region of 8 to 13 µm. Meanwhile, a period of the plasmon periodic structure (periodic pitch of the conductor disk defined by the length of one side of the unit constituent region) is adjusted to 4.5 to 5.5 µm along each of two directions orthogonal to each other. Therefore, it is possible to use an absorption peak of diffraction by the plasmon periodic structure (use an absorption enhancement effect by diffraction), and an electromagnetic wave of the "atmospheric window" corresponding to the wavelength region of 4.5 to 5.5 µm is selectively emitted.

DESCRIPTION OF EMBODIMENTS OF PRESENT DISCLOSURE

A radiation device of the present disclosure is a plasmonic metamaterial that uses using a metal or the like having a nano/micro order fine structure to converts heat into an electromagnetic wave (light), and the radiation device enables efficient use of a plurality of wavelength regions in "atmospheric windows" by giving a periodic structure (plasmon periodic structure) in the above fine structure and by controlling a period of the periodic structure. That is, the radiation device according to the present embodiment uses both a diffraction mode due to the plasmon periodic structure and the resonance mode due to plasmons and enables heat converted into an electromagnetic wave in a wavelength region of 4.5 to 5.5 µm as well as a conventionally used wavelength region of 8 to 13 µm to be irradiated to the outside of the atmosphere. First, the contents of embodiments of the present disclosure will be listed and described individually.

(1) The radiation device according to the present embodiment comprises a conductor layer, a semiconductor layer, and a plurality of conductor disks. The conductor layer has a first lower surface and a first upper surface that are arranged so as to oppose each other along a first direction. The semiconductor layer is provided on the first upper surface of the conductor layer and has a second lower surface facing the first upper surface and a second upper surface opposing the second lower surface. The conductor disks are provided on the second upper surface of the semiconductor layer in a state in which the conductor disks are separated from each other. Moreover, the plurality of conductor disks are arranged so that each of the plurality of unit constituent regions having the same region and the same shape set on the second upper surface has the same arrangement pattern. Note that each of the plurality of unit constituent regions has a rectangular shape having a side with a length of 4.5 µm or more and 5.5 µm or less. The plurality of unit constituent regions having such a structure are arranged so that adjacent unit constituent regions have a common side along each of second and third directions that are defined on the second upper surface and orthogonal to each other. As a result, a two-dimensional periodic structure (plasmon periodic structure) of the arrangement pattern having periodicity along each of the second and third directions is constituted on the second upper surface. The arrangement pattern includes nine conductor disks arranged so as to constitute a 3×3 matrix in which three elements are arranged along one side (first side) of sides orthogonal to each other among sides constituting the rectangular shape and three elements are arranged along the other side (second side). Furthermore, the nine conductor disks include four or more kinds of conductor disks that have diameters that are defined on the second upper surface and different from each other. Note that in the present specification, the "rectangle" means a quadrangle including a square in which all four internal angles are equal.

As described above, according to the present embodiment, a plurality of unit constituent regions are arranged on the second upper surface without a gap along each of the second and third directions that are defined on the second upper surface and orthogonal to each other. As a result, there is obtained a two-dimensional periodic structure having a period pitch matching the length of each of two adjacent sides (corresponding to the first and second sides) sandwiching one internal angle (right angle) among four sides defining the rectangle, that is, a two-dimensional periodic structure of an arrangement pattern of a plurality of conductor disks. Note that in the present specification, the "two-dimensional periodic structure" means a structure having periodicity along each of two directions orthogonal to each other. That is, in a case where a quadrangle in which two adjacent sides sandwiching one internal angle have different lengths is adopted as a planar shape of the unit constituent region, a two-dimensional periodic structure having different periodic pitches along each of second and third directions orthogonal to each other is formed on the second upper surface. In the present embodiment, there is obtained a radiation device that use both the diffraction mode due to such a two-dimensional periodic structure and the resonance mode due to the effect of plasmons and has high emissivity for both at least an electromagnetic wave in a wavelength region corresponding to an atmospheric window having a wavelength of 4.5 to 5.5 μm and an electromagnetic wave in a wavelength region corresponding to an atmospheric window having a wavelength of 8 to 13 μm. In particular, even in a case where lengths of two adjacent sides sandwiching one internal angle are different, if the lengths of the two adjacent sides are both within the range of 4.5 to 5.5 μm, it is possible to use the atmospheric window having the wavelength of 4.5 to 5.5 μm. Moreover, in the present embodiment, the semiconductor layer that absorbs less in a wavelength region shorter than 8 μm is arranged between the conductor layer and the conductor disk instead of the dielectric layer. As a result, a heat-electromagnetic wave conversion characteristics in a mid-infrared wavelength region that is a wavelength region of the atmospheric window is improved.

(2) As one aspect of the present embodiment, each of the plurality of conductor disks is preferably comprised of Al. Moreover, as one aspect of the present embodiment, the conductor layer is preferably comprised of Al. In either case, if Al is used as a layer constituent material, it is possible to reduce a manufacturing cost of the radiation device. In particular, in a case where both the plurality of conductor disks and the conductor layers are comprised of Al, the kinds of layer constituent materials to be prepared can be reduced, so that the manufacturing cost of the radiation device can be further reduced.

(3) As one aspect of the present embodiment, the thickness of each of the plurality of conductor disks defined along the first direction is preferably thinner than the thickness of the conductor layer. Specifically, as one aspect of the present embodiment, the thickness of each of the plurality of conductor disks is preferably 100 nm or less in order to improve the controllability of a shape of each of the conductor disks. Moreover, as one aspect of the present embodiment, the thickness of the conductor layer defined along the first direction is preferably 100 nm or more in order to prevent the transmission of an electromagnetic wave.

(4) As one aspect of the present embodiment, the nine conductor disks arranged in one unit constituent region preferably include seven or less kinds of conductor disks having diameters different from each other, while the nine conductor disks include three conductor disks having a minimum diameter. In this case, it is possible to improve emissivity on a short wavelength side in a desired radiation wavelength region as compared with a case where four or more kinds of conductor disks having different diameters are included.

(5) As one aspect of the present embodiment, the lengths of two adjacent sides sandwiching one internal angle may be different from each other. In a case where the lengths of these two adjacent sides are both 4.5 to 5.5 μm (a difference between the lengths of the two sides is 1 μm or less), it is possible to effectively use the atmospheric window having the wavelength of 4.5 to 5.5 μm. Moreover, as one aspect of the present embodiment, the planar shape of the unit constituent region may be a square shape in which the lengths of two adjacent sides sandwiching one internal angle are the same. In a case where the plane shape of the unit constituent region is set to a square shape in this way, it is possible to reduce the polarization dependence of the radiation device.

(6) An emission cooling device according to the present embodiment includes a radiation device having the above-described structure. The emission cooling device, as one aspect thereof, is equipped with the radiation device according to the present embodiment mounted on a substrate layer including a material having relatively high heat conduction efficiency and capable of forming a smooth surface. Moreover, the surface of the semiconductor layer of the radiation device is preferably provided with a surface protective layer (reflection film) so as to cover the plurality of conductor disks for the purpose of protecting the plurality of conductor disks and reflecting external light.

As described above, each aspect listed in the [Description of Embodiments of Present Disclosure] is applicable to each of all remaining aspects or to all combinations of these remaining aspects.

Details of Embodiments of Present Disclosure

Hereinafter, specific structures of the radiation device and the cooling device according to the present embodiments will be described in detail with reference to the accompanying drawings. Note that the present disclosure is not limited to these examples and is indicated by the scope of claims, and is intended to include all modifications within the meanings and scopes equivalent to the scope of claims. Note that in the description of the drawings, the same elements will be denoted by the same reference sign, and redundant description will be omitted.

Figure 1:
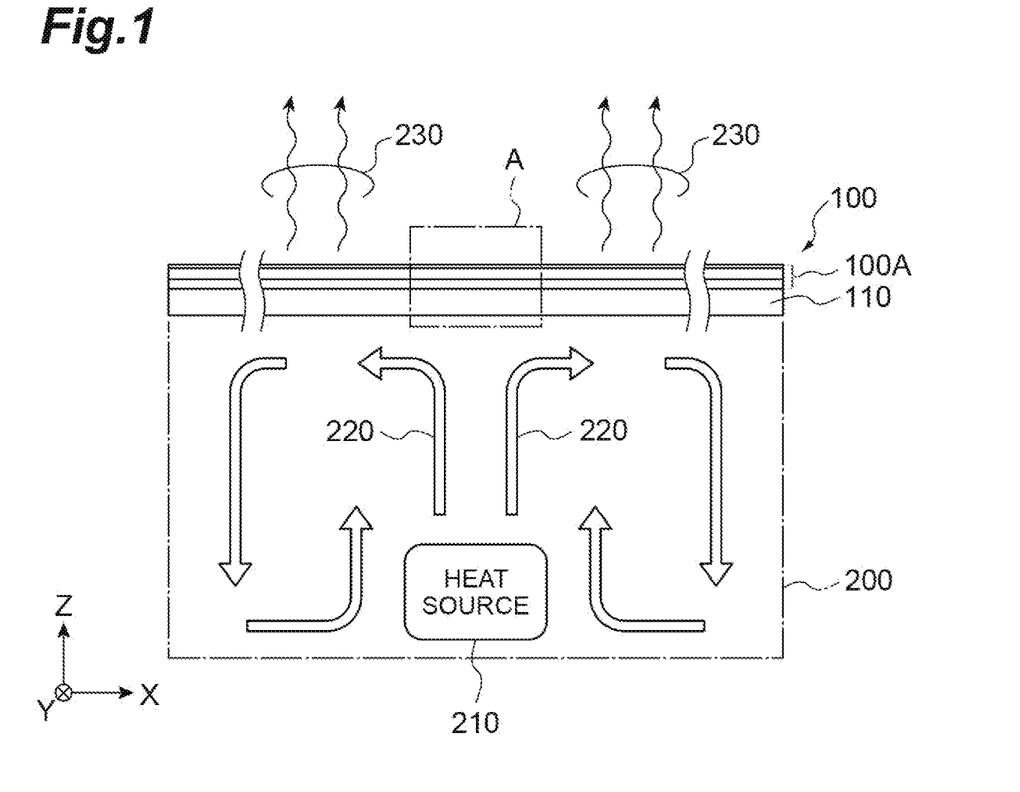
FIG. 1 is a diagram for describing a schematic configuration of an emission cooling device according to the present embodiment.
Figure 2:
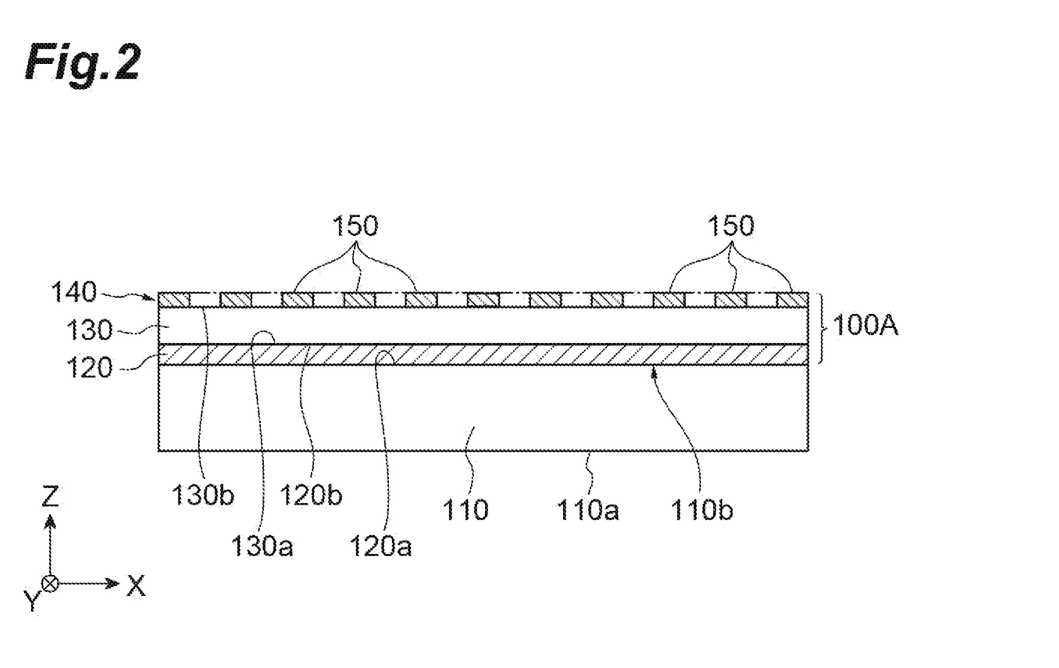
FIG. 2 is a diagram showing a cross-sectional structure of a region A shown in FIG. 1 of the emission cooling device according to the present embodiment.

FIG. 1 is a diagram for describing a schematic configuration of the emission cooling device according to the present embodiment, and FIG. 2 is a diagram showing a cross-sectional structure of a region A of the emission cooling device according to the present embodiment shown in FIG. 1. Note that each figure shall be represented by an XYZ Cartesian coordinate system.

As shown in FIG. 1, the emission cooling device 100 according to the present embodiment is a radiation panel or the like having a spectrum having high emissivity in a wavelength band of the atmospheric window. The emission cooling device 100 has a structure in which the radiation device 100A (radiation device according to the present embodiment) is mounted on the substrate layer 110. Moreover, in the emission cooling device 100, a device surface (side of the radiation device 100A) that emits an electromagnetic wave in a specific wavelength region is oriented to the outside of a building 200, while a device back surface (side of the substrate layer 110) is arranged so as to directly or indirectly come in contact with air warmed by a heat source 210 in the building 200.

The emission cooling device 100 absorbs the air warmed in the building 200, converts the air into an electromagnetic wave 230 in a window wavelength region of the atmospheric window, and emits the electromagnetic wave 230 to the outside of the building 200. In order to achieve thermal equilibrium with the universe through a wavelength region of the atmospheric window, the emission cooling device 100 loses thermal energy and the temperature thereof drops. Since the warmed air in the building 200 is in contact with the back surface of the emission cooling device 100 as described above, the warmed air is cooled by transferring the heat energy stored once to the emission cooling device 100. Since the cooled air is returned indoors by natural convection 220 or forced circulation in the building 200, the emission cooling device 100 according to the present embodiment can function as cooling.

Specifically, as shown in FIG. 2, the emission cooling device 100 includes the substrate layer 110 having a lower surface 110a and an upper surface 110b that are arranged so as to oppose each other along a Z-axis (first direction) and the radiation device 100A provided on the upper surface 110b of the substrate layer 110. Note that the lower surface 110a of the substrate layer 110 corresponds to the device back surface. The substrate layer 110 is comprised of a material having relatively high heat conduction efficiency and capable of forming a smooth surface. The radiation device 100A includes the conductor layer 120, the semiconductor layer 130, and the surface protection layer 140 including a plurality of conductor disks 150. The conductor layer 120 is provided on the upper surface 110b of the substrate layer 110 and has the lower surface 120a facing the upper surface 110b and the upper surface 120b opposing the lower surface 120a. The semiconductor layer 130 is provided on the upper surface 120b of the conductor layer 120 and has the lower surface 130a facing the upper surface 120b and the upper surface 130b opposing the lower surface 130a. The plurality of conductor disks 150 is arranged on the upper surface 130b of the semiconductor layer 130 in a state in which the plurality of conductor disks 150 are separated from each other. Moreover, the surface protective layer (reflection film) 140 is provided on the upper surface 130b of the semiconductor layer 130 so that the surface protective layer covers the plurality of conductor disks 150 in order to protect the plurality of conductor disks 150 and prevent light from being incident from the outside of the device.

Next, the arrangement of the plurality of conductor disks 150 provided on the upper surface 130b of the semiconductor layer 130 will be described with reference to FIGS. 3 and 4. Note that FIG. 3 is a plan view for describing the two-dimensional periodic structure of the arrangement pattern of the plurality of conductor disks 150, and FIG. 4 is a plan view for describing the arrangement pattern of the conductor disks 150 in the unit constituent region R.

Figure 3:
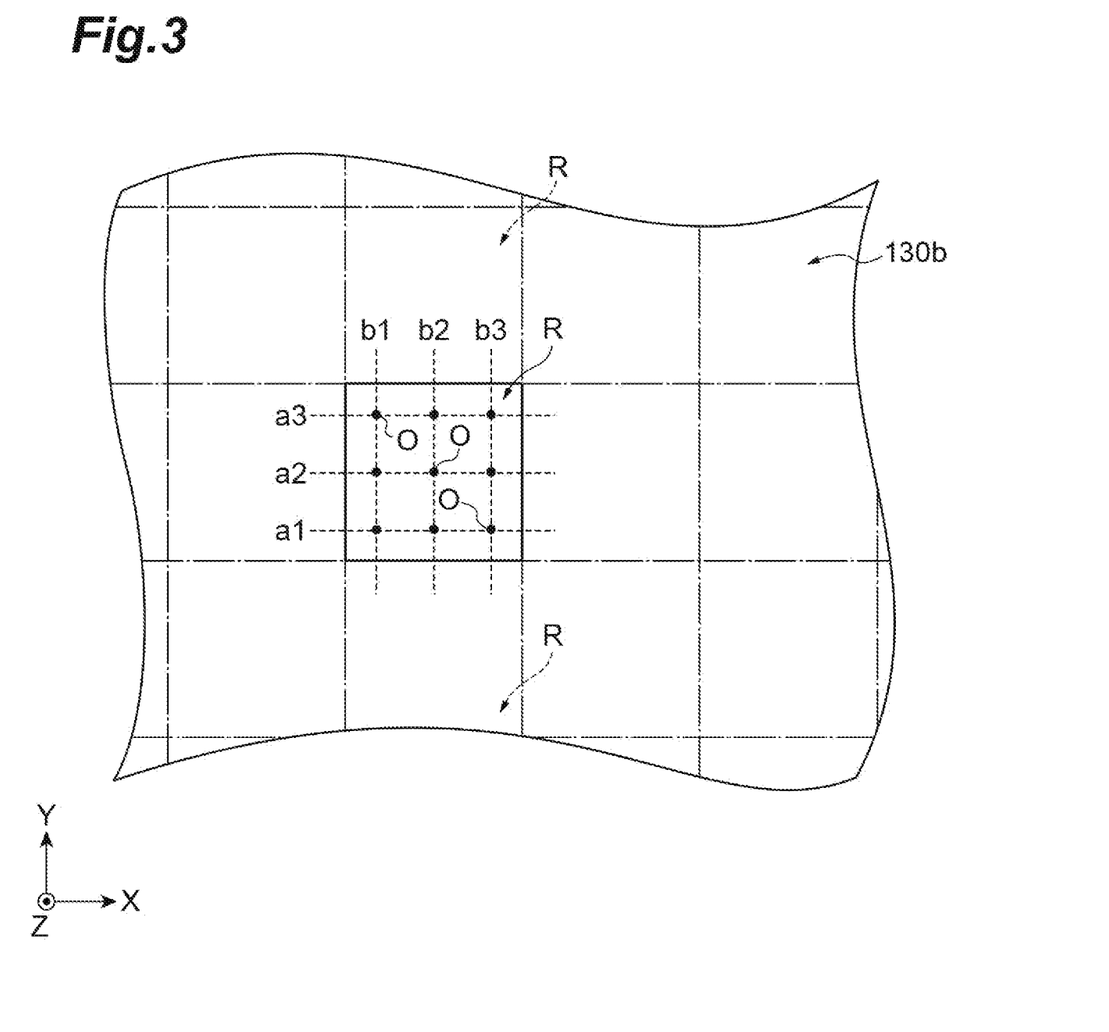
FIG. 3 is a plan view for describing a two-dimensional periodic structure of an arrangement pattern of a conductor disk provided on a semiconductor layer.
Figure 4:
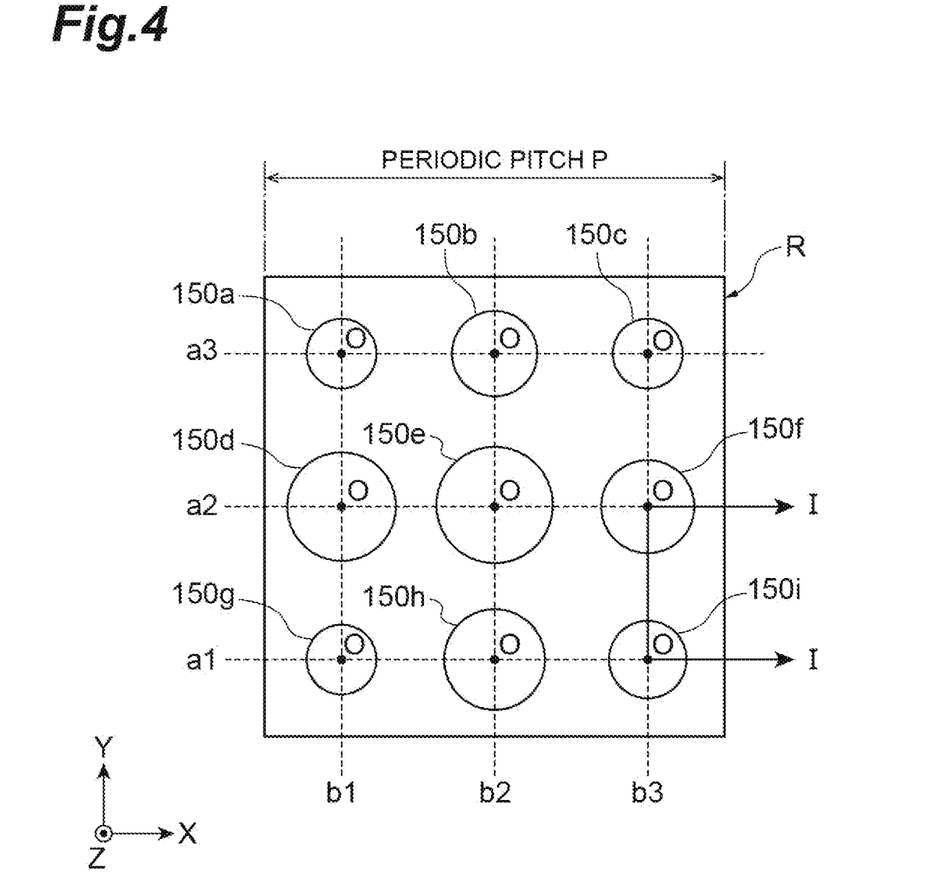
FIG. 4 is a plan view for describing the arrangement pattern of the conductor disk in a unit constituent region R.

As shown in FIG. 3, the plurality of conductor disks 150 are arranged so that each of the plurality of unit constituent regions R having the same area and the same shape, which is set on the upper surface 130b surface of the semiconductor layer 130, has the same arrangement pattern. Moreover, as a planar shape of each of the plurality of unit constituent regions R, there is adopted a rectangular shape in which the lengths of two adjacent sides sandwiching one internal angle are different from each other, while the lengths of the two adjacent sides are 4.5 μm or more and 5.5 μm or less or a rectangular shape (square shape) in which the lengths of two sides sandwiching one internal angle are the same length, while the lengths of the two adjacent sides each are 4.5 μm or more and 5.5 μm or less. Note that in the following description, a case where each unit constituent region R has a square shape will be described as an example of the rectangular shape. That is, in an example of FIG. 3, each of the plurality of unit constituent regions R has a square shape having a side with a length of 4.5 μm or more and 5.5 μm or less. The plurality of unit constituent regions R having such a structure are arranged on the upper surface 130b without any gap so that the unit constituent regions R adjacent to each other have a common side, that is, come into contact with each other along both an X-axis and a Y-axis orthogonal to each other, shown in FIG. 3. As a result, the two-dimensional periodic structure of the arrangement pattern of the plurality of conductor disks 150 is constituted on the upper surface 130b. This two-dimensional periodic structure is an infrared plasmon periodic structure that generates an electromagnetic wave in a mid-infrared wavelength region, and the length of one side of the unit constituent region R corresponds to a periodic pitch P of this two-dimensional periodic structure. In the example of FIG. 3, the arrangement pattern in each unit constituent region R includes nine conductor disks arranged so as to constitute a 3×3 matrix in which three elements are arranged along one side of sides orthogonal to each other among sides constituting the square shape and three elements are arranged along the other side. That is, there is arranged the conductor disk 150 so that the center of the conductor disk 150 corresponds so as to match each of intersection points (lattice points) O of lines a1 to a3 set at equal intervals parallel to the X-axis and lines b1 to b3 set at equal intervals parallel to the Y-axis.

Moreover, the nine conductor disks arranged in one unit constituent region R include four or more kinds of conductor disks having diameters that are different from each other and defined in a direction along the Y-axis or the X-axis (second direction). In an example of FIG. 4, nine conductor disks 150a to 150i are arranged in the unit constituent region R in a state in which the nine conductor disks 150a to 150i are separated from each other on the intersection points O of the lines a1 to a3 and the lines b1 to b3. The diameter of the first conductor disk 150a is 0.9 μm. The diameter of the second conductor disk 150b is 1.1 μm. The diameter of the third conductor disk 150c is 0.9 μm. The diameter of the fourth conductor disk 150d is 1.4 μm. The diameter of the fifth conductor disk 150e is 1.5 μm. The diameter of the sixth conductor disk 150f is 1.2 μm. The diameter of the seventh conductor disk 150g is 0.9 μm. The diameter of the eighth conductor disk 150h is 1.3 μm. The diameter of the ninth conductor disk 150i is 1.0 μm. That is, in the example of FIG. 4, the nine conductor disks arranged in one unit constituent region R include the three conductor disks 150a, 150c, and 150g having a minimum diameter (0.9 μm) and includes seven kinds of conductor disks having diameters different from each other (0.9 μm, 1.0 μm, 1.1 μm, 1.2 μm, 1.3 μm, 1.4 μm, and 1.5 μm). Note that in the example of FIG. 4, a center interval (that is, an interval of the intersection points O) of the conductor disks adjacent to each other is 1.7 μm, and the length of one side of the unit constituent region R corresponding to the periodic pitch P is set to 5.1 μm.

The inventors have noted that when a combination of a plurality of disk patterns (arrangement patterns) is arranged periodically as disclosed in Non-Patent Document 1, diffraction of an electromagnetic wave having a wavelength depending on a period of the disk pattern also occurs. In general, a wavelength at which diffraction occurs and a period of an arrangement pattern are approximately equal to each other. Therefore, in the present embodiment, a period is set to 4.5 to 5.5 μm. As a result, radiation in a wavelength region of 4.5 to 5.5 μm, which is different from the conventionally used "atmospheric window" having a wavelength of 8 to 13 μm, is also used. Moreover, the disk diameter is generally within the range of 1±0.5 μm (0.5 to 1.5 μm) as described in Non-Patent Document 1 in order to generate radiation due to the effect of plasmons at a wavelength of 8 to 13 μm. Considering spaces between the adjacent disks, in a case where the period is set within the range of 4.5 to 5.5 μm, it is appropriate that one arrangement pattern (per one unit constituent region) includes a total of nine disks that is three disks×three disks. Therefore, the radiation device 100A according to the present embodiment has radiation characteristics in the "atmospheric window" having a wavelength of 8 to 13 μm due to the resonance mode of plasmons obtained by combining the arrangement and diameter of nine conductive disks 150a to 150i constituting one arrangement pattern. Furthermore, in the radiation device 100A, the periodic pitch P (corresponding to the length of one side of the unit constituent region R) of the arrangement pattern is set to 4.5 to 5.5 μm. As a result, the radiation device 100A has radiation characteristics even in the "atmospheric window" having a wavelength of 4.5 to 5.5 μm due to the diffraction mode. Note that since absorptivity is equal to emissivity in the radiation device, a vertical axis of a graph may be represented by absorptivity or emissivity to show wavelength characteristics.

Figure 5:
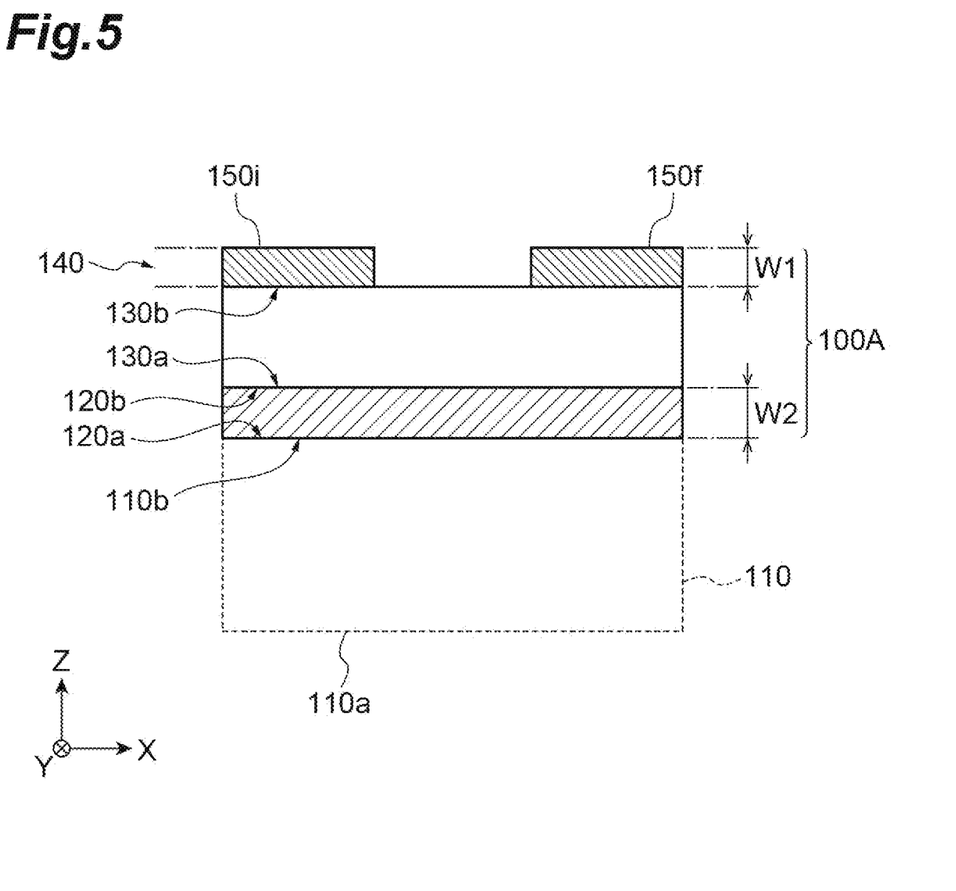
FIG. 5 is a diagram showing a cross-sectional structure of a radiation device according to the present embodiment.

FIG. 5 is a diagram showing a cross-sectional structure of the radiation device 100A according to the present embodiment. Specifically, the cross-sectional structure of FIG. 5 corresponds to a cross-section of the radiation device 100A shown by I-I line in FIG. 4.

As described above, the radiation device 100A according to the present embodiment is mounted on the upper surface 110b of the substrate layer 110 including, for example, Si. Note that in a case where the radiation device 100A is actually used as the emission cooling device 100, the heat source 210 is installed below the substrate layer 110 (Si substrate) as shown in FIG. 1. As an example, the radiation device 100A includes an Al layer corresponding to the conductor layer 120, a Si layer corresponding to the semiconductor layer 130, and an Al disk (conductor disk including Al) corresponding to the conductor disks 150 (150f and 150i) included in the surface protection layer 140.

A thickness W1 of the conductor disk 150 (Al disk) defined along the Z-axis is preferably as thin as about 30 to 100 nm in order to improve the controllability of the shape, thereby being able to reduce the manufacturing cost. Note that when the thickness W1 changes, the radiation characteristics also change slightly, but within this range, sufficient emissivity can be obtained in the wavelength region having a wavelength of 8 to 13 μm. Moreover, a thickness W2 of the conductor layer 120 (Al layer) defined along the Z-axis direction is preferably about 100 to 200 nm. This is because if the Al layer is too thin, an electromagnetic wave is transmitted. Therefore, in the present embodiment, the thickness W2 is set to be thicker than the thickness W1.

As a material applied to the semiconductor layer 130 (Si layer) that is sandwiched between two Al layers along the Z-axis, Si, Ge, and the like that absorb less in a wavelength region shorter than 8 μm and in the mid-infrared wavelength region, are preferable.

Note that as constituent materials of the conductor layer 120 and the conductor disks 150 (150a to 150i), Au, Ag, Cu and the like are applicable in addition to Al. As a constituent material of the substrate layer 110 located at a bottom layer, a material having relatively high thermal conductivity and capable of forming a smooth surface is suitable, and for example, Si, diamond, Al and the like are preferable. For the diameter of each of the conductor disks 150a to 150i, there is selected a diameter at which high emissivity in the wavelength region of 8 to 13 μm is obtained when analysis by the FDTD method is repeated in the range of 0.8 to 1.5 μm.

The radiation device 100A having the above-described structure is manufactured as follows. That is, an Al layer having a thickness of 100 nm and a Si layer having a thickness of 500 nm are continuously formed on a silicon substrate (substrate layer 110) by a sputtering method. Next, a resist pattern having a thickness of 150 nm is formed on the Si layer by a lithography technique, and then an Al layer having a thickness of 50 nm is formed by a sputtering method. The Al layer and a resist that do not contribute to the formation of the conductor disks 150a to 150i are removed by a lift-off method using N-methylpyrrolidone.

(Radiation Characteristics)

Next, the radiation characteristics formed by the FDTD method will be described. This calculation of the radiation characteristics was carried out for a configuration in which a plane wave is incident from vertically above an infinity region in a state in which the unit constituent region R spreads over the infinity region. Note that the substrate layer 110 (Si layer) is omitted because the substrate layer 110 (Si layer) has essentially no effect.

Figure 6:
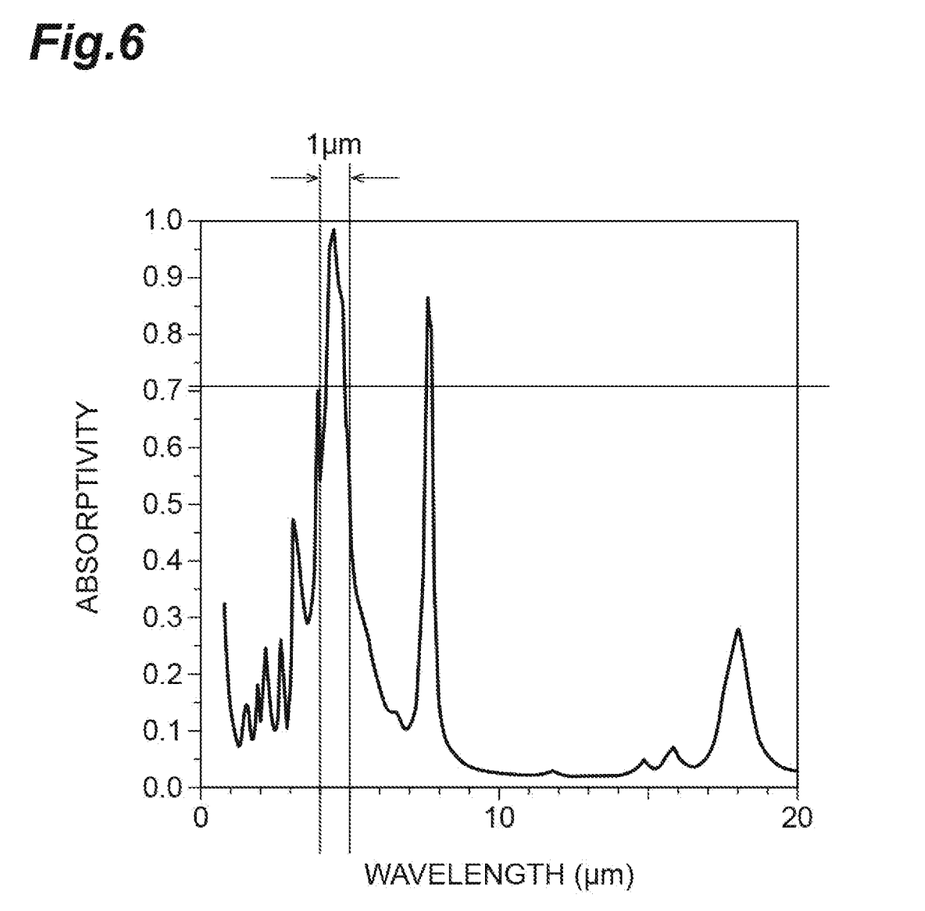
FIG. 6 is an absorption spectrum of the radiation device having a reference arrangement pattern of the conductor disk.

FIG. 6 is an absorption spectrum of the radiation device having a reference arrangement pattern of the conductor disk. Note that in the absorption spectrum of FIG. 6, a horizontal axis indicates a wavelength (pin), and a vertical axis indicates absorptivity at a reference period pitch. A value of the absorptivity on the vertical axis is normalized with the maximum value set to 1.

One side (periodic pitch P) of the prepared unit constituent region R is set to 5.1 μm. Moreover, the diameters of the nine conductor disks arranged in the unit constituent region R are all unified to be 1.2 μm, and the center interval between the conductor disks is set to 1.7 μm.

As can be seen from FIG. 6, a band at which an absorptivity of 0.7 or more can be obtained is secured at approximately 1 μm near a wavelength of 5 μm that substantially matches the periodic pitch P. Considering that absorptivity in the "atmospheric window" corresponding to the wavelength region of 8 to 13 μm can be obtained by superposition, a combination of four or more kinds of conductor disks having different diameters is preferable. Furthermore, among the plurality of conductor disks, a disk having a small diameter has a small effective area with respect to incident light. Therefore, a plurality of conductor disks having a minimum diameter are preferably arranged in the unit constituent region R. For example, in the example of FIG. 4, the three conductor disks 150a, 150c, and 150g having a minimum diameter of 0.9 μm are arranged.

Figure 7:
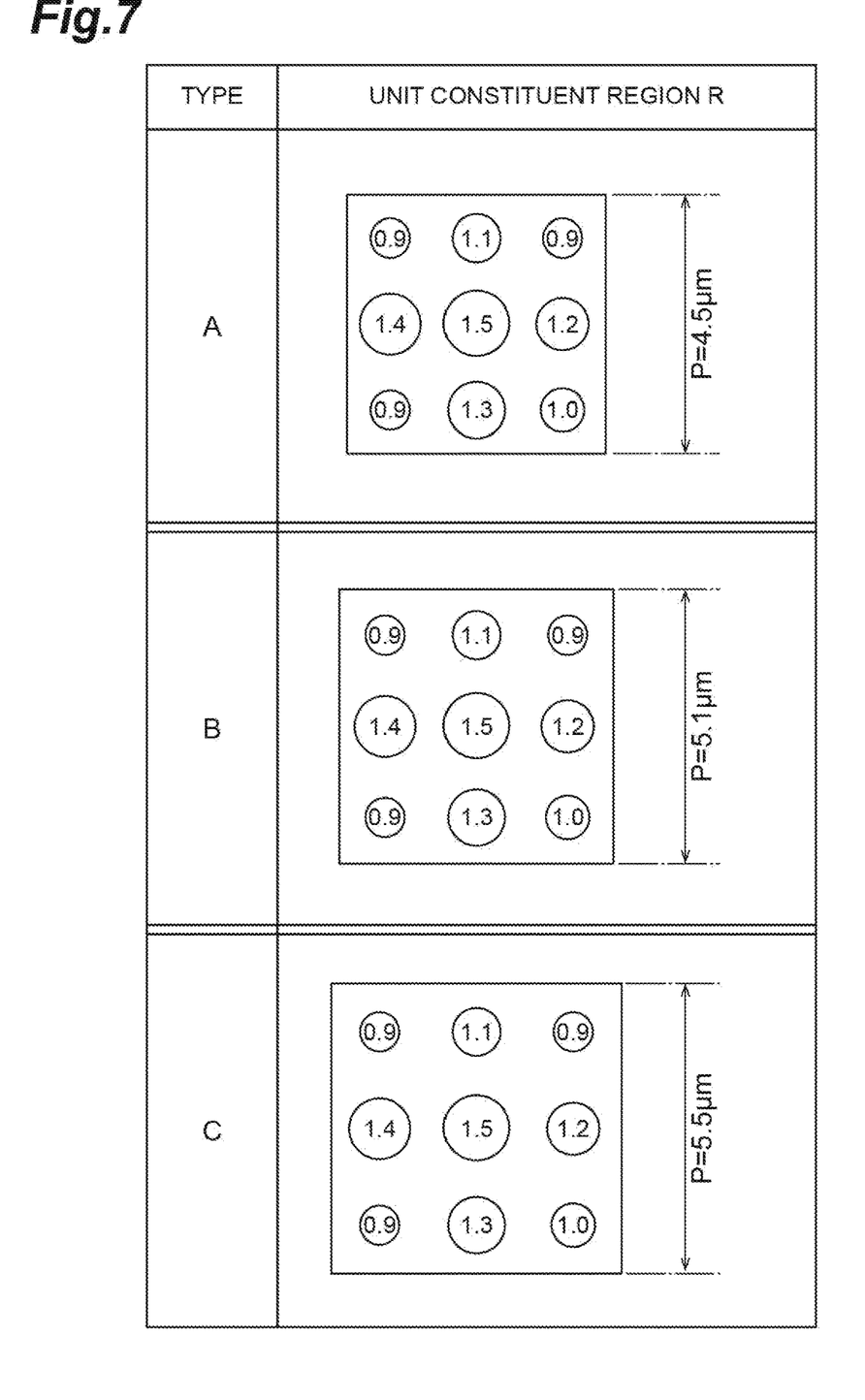
FIG. 7 is a diagram showing unit constituent regions R of types A to C having different periodic pitches P (matches the length of one side).

FIG. 7 is a diagram showing unit constituent regions R of types A to C having different periodic pitches P (match lengths of one side). In the unit constituent region R of the type A, one side corresponding to the periodic pitch P of the two-dimensional periodic structure constituted on the semiconductor layer 130 is set to 4.5 μm, and the center interval between the conductor disks is set to 1.5 μm. In the unit constituent region R of the type B, one side corresponding to the periodic pitch P of the two-dimensional periodic structure constituted on the semiconductor layer 130 is set to 5.1 μm, and the center interval of the conductor disk is set to 1.7 μm. In the unit constituent region R of the type C, one side corresponding to the periodic pitch P of the two-dimensional periodic structure constituted on the semiconductor layer 130 is set to 5.5 μm, and the center interval of the conductor disk is set to 1.833 μm. Moreover, nine conductor disks corresponding to the conductor disks 150a to 150i shown in FIG. 4 are arranged in each of the unit constituent regions R of the types A to C. That is, any of the unit constituent regions R of the types A to C includes seven kinds of conductor disks having diameters different from each other (0.9 μm, 1.0 μm, 1.1 μm, 1.2 μm, 1.3 μm, 1.4 μm, and 1.5 μm), of which three conductor disks have a minimum diameter of 0.9 μm. Note that numbers shown in each unit constituent region R in FIG. 7 indicate the diameter of each conductor disk.

Figure 8:
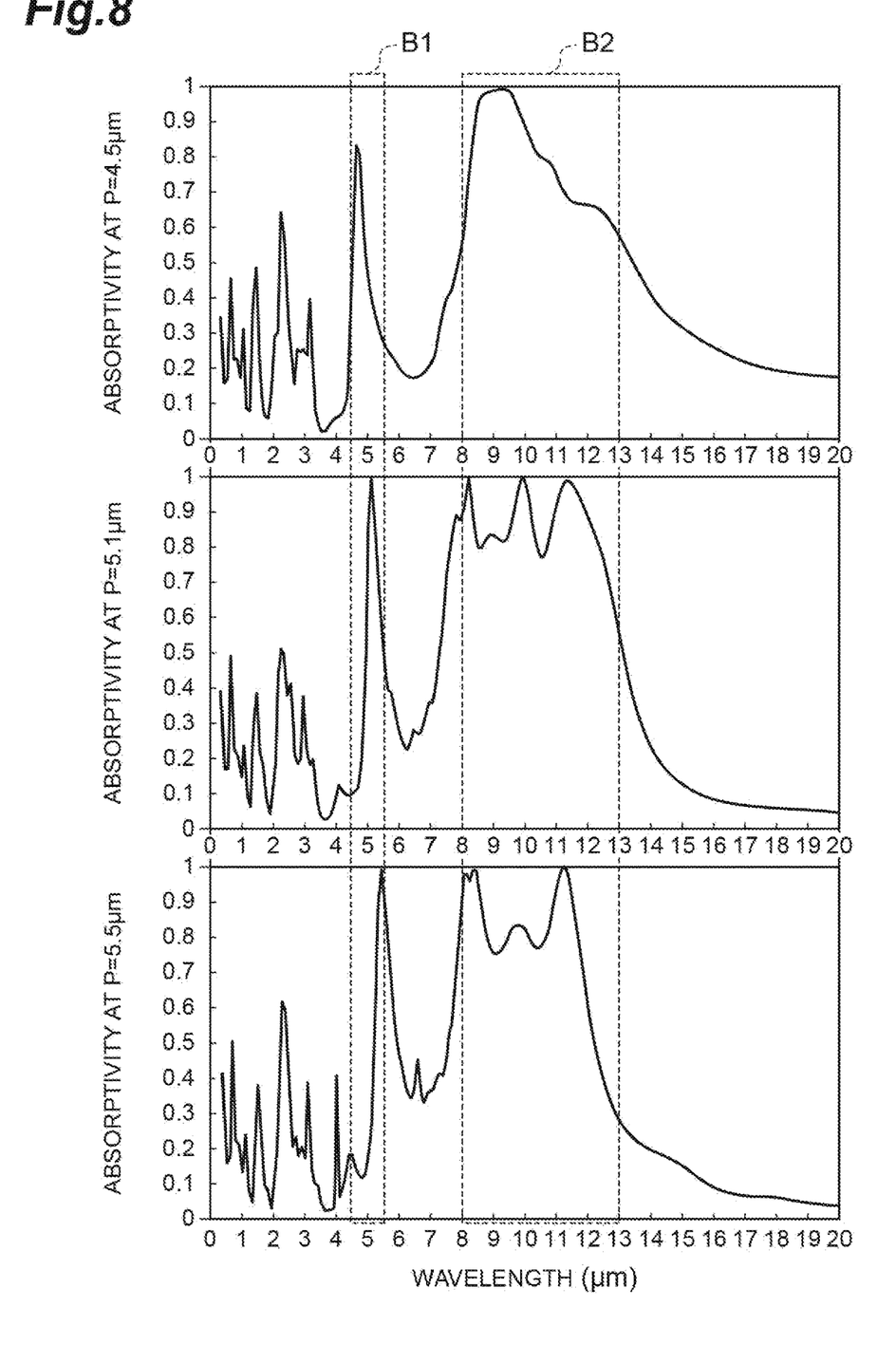
FIG. 8 shows absorption spectra of a plurality of samples of the radiation device in which the two-dimensional periodic structure of the disk arrangement pattern of the conductor disk is constituted on the basis of the unit constituent regions R of the types A to C shown in FIG. 7.

FIG. 8 shows absorption spectra of a plurality of samples of the radiation device in which the two-dimensional periodic structure of the arrangement pattern of the conductor disk 150 is constituted on the basis of the unit constituent regions R of the types A to C shown in FIG. 7. In the absorption spectrum of FIG. 8, a horizontal axis indicates a wavelength (pin), and a vertical axis indicates absorptivity of each periodic pitch P of 4.5 μm (type A in FIG. 7), 5.1 μm (type B in FIG. 7), and 5.5 μm (type C in FIG. 7). Note that a value of the absorptivity of each periodic pitch P on the vertical axis is normalized with the maximum value set to 1. As described above, the calculation of the radiation characteristics was also carried out for the configuration in which a plane wave is incident from vertically above an infinity region with the unit constituent region R spread over the infinity region. Note that the substrate layer 110 (Si layer) is omitted because the substrate layer 110 (Si layer) has essentially no effect.

In FIG. 8, a region B1 surrounded by a broken line shows the wavelength region of 4.5 to 5.5 μm among the "atmospheric windows," and the region B2 shows the wavelength region of 8 to 13 μm among the "atmospheric windows." As can be seen from FIG. 8, in the sample to which any of the types A to C is applied, large absorptivity can be obtained in the wavelength region of 8 to 13 μm corresponding to the region B2. Similarly, large absorptivity can be obtained in the wavelength region of 4.5 to 5.5 μm corresponding to the region B1. In particular, in the region B1, an absorption peak due to diffraction changes as the periodic pitch P changes. From this, by controlling the periodic pitch P (the length of one side of the unit constituent region R), it is possible to obtain large absorption near the "atmospheric window" corresponding to the wavelength region of 4.5 to 5.5 μm.

REFERENCE SIGNS LIST

100 . . . Emission cooling device (radiation panel); 100A . . . Radiation device; 110 . . . Substrate layer; 120 . . . Conductor layer; 130 . . . Semiconductor layer; 140 . . . Surface protection layer; and 150, 150a to 150i . . . Conductor disk.

The invention claimed is:

1. A radiation device comprising:
a conductor layer comprising aluminum and having a first lower surface and a first upper surface that are arranged so as to oppose each other along a first direction;
a semiconductor layer comprising silicon and being provided on the first upper surface of the conductor layer, the semiconductor layer having a second lower surface facing the first upper surface and a second upper surface opposing the second lower surface; and
a plurality of conductor disks provided on the second upper surface of the semiconductor layer in a state in which the plurality of conductor disks are separated from each other, wherein
a thickness of each of the plurality of conductor disks that is defined along the first direction is 30 nm or more and 100 nm or less, and
the plurality of conductor disks are arranged so that a same arrangement pattern is constituted in each of a plurality of unit constituent regions having a same region and a same shape set on the second upper surface;
each of the plurality of unit constituent regions has a rectangular shape having a side with a length of 4.5 μm or more and 5.5 μm or less, and the plurality of unit constituent regions are arranged so that the unit constituent regions adjacent to each other along each of second and third directions that are defined on the second upper surface and orthogonal to each other have a common side, and as a result, a two-dimensional periodic structure of the arrangement pattern having periodicity along each of the second and third directions is constituted;
the arrangement pattern includes nine conductor disks arranged so as to correspond to a 3×3 matrix in which three elements are arranged along a first side of the rectangular shape and three elements are arranged along a second side orthogonal to the first side; and
the nine conductor disks include at least four conductor disks having different diameters from each other, the diameters being defined on the second upper surface.

2. The radiation device according to claim 1, wherein the thickness of each of the plurality of conductor disks that is defined along the first direction is thinner than a thickness of the conductor layer.

3. The radiation device according to claim 1, wherein each of the plurality of conductor disks is comprised of aluminum.

4. The radiation device according to claim 1, wherein a thickness of the conductor layer that is defined along the first direction is 100 nm or more.

5. The radiation device according to claim 1, wherein the nine conductor disks include seven or less conductor disks having diameters different from each other.

6. The radiation device according to claim 1, wherein the rectangular shape is square.

7. An emission cooling device comprising:
the radiation device according to claim 1,
wherein a substrate layer is arranged so as to directly or indirectly come in contact with air warmed by a heat source.

* * * * *